US00RE34863E

United States Patent [19]

English et al.

[11] E Patent Number: Re. 34,863

[45] Reissued Date of Patent: Feb. 21, 1995

[54] HIGH IMPEDANCE CIRCUIT FOR INJECTION LOCKED MAGNETRONS

[75] Inventors: Robert C. English, Bloomington, Ind.; Geoffrey Thornber, Aptos, Calif.; Christopher M. Walker, Montoursville, Pa.

[73] Assignee: Litton Systems, Inc., Beverly Hills, Calif.

[21] Appl. No.: 83,093

[22] Filed: Jun. 25, 1993

Related U.S. Patent Documents

Reissue of:

[64] Patent No.: 5,045,814
Issued: Sep. 3, 1991
Appl. No.: 493,496
Filed: Mar. 14, 1990

[51] Int. Cl.[6] ..... H03B 9/10; H01J 23/22; H01J 25/50

[52] U.S. Cl. ..... 331/86; 315/39.51; 315/39.69; 315/39.73

[58] Field of Search ..... 331/86, 87; 315/39.51, 315/39.63, 39.69, 39.73

[56] References Cited

U.S. PATENT DOCUMENTS

| | | | |
|---|---|---|---|
| 2,992,362 | 7/1961 | Boyd | 315/39.69 |
| 3,305,693 | 2/1967 | Hull | 315/39.69 |
| 3,450,932 | 1/1969 | Farney | 315/39.73 |
| 4,056,756 | 11/1977 | Derby | 315/39.69 |
| 4,720,659 | 1/1988 | Aiga et al. | 315/39.69 |

FOREIGN PATENT DOCUMENTS

| | | |
|---|---|---|
| 2-165543 | 6/1990 | Japan . |
| 2150376A | 6/1985 | United Kingdom . |

OTHER PUBLICATIONS

Adler, Robert; "A Study of Locking Phenomena In Oscillators"; *Proc. IRE;* Jun. 1946; pp. 351–357.

Huntoon & Weiss; "Synchronization Of Oscillators"; *Proc. IRE;* Dec. 1947; pp. 1415–1423.

David, E. E.; "RF Phase Control In Pulsed Magnetrons"; *Proc. IRE;* Jun. 1952; pp. 669–685.

Nelson, R. B. "Methods of Tuning Multiple-Cavity Magnetrons" *Proceedings Of The I.R.E.;* Jan., 1948; pp. 53–56.

*Primary Examiner*—David Mis
*Attorney, Agent, or Firm*—Graham & James

[57] ABSTRACT

A high impedance circuit has radially disposed first vanes and radially disposed second vanes interdigitating between the first vanes. The first vanes and the second vanes are each interconnected by a first toroidal strap and a second toroidal strap, respectively. The first strap and the second strap are disposed co-axially on opposite sides of the vane structure. The vanes and straps are dimensioned so that the circuit has a single cavity impedance commensurate with a predetermined interaction impedance for the oscillator which is sufficient to sustain oscillation for a preselected injection locking bandwidth of the oscillator.

20 Claims, 2 Drawing Sheets

FIG. 1
(PRIOR ART)
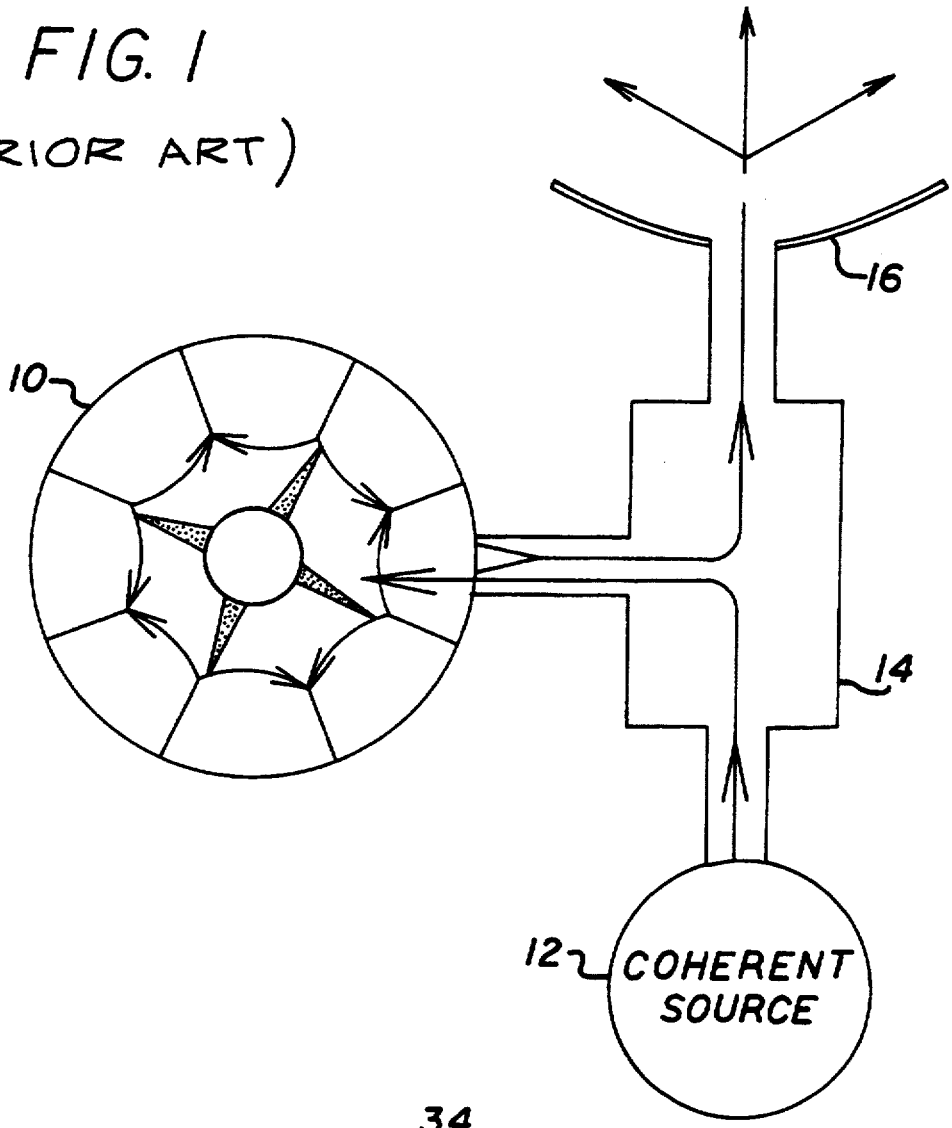
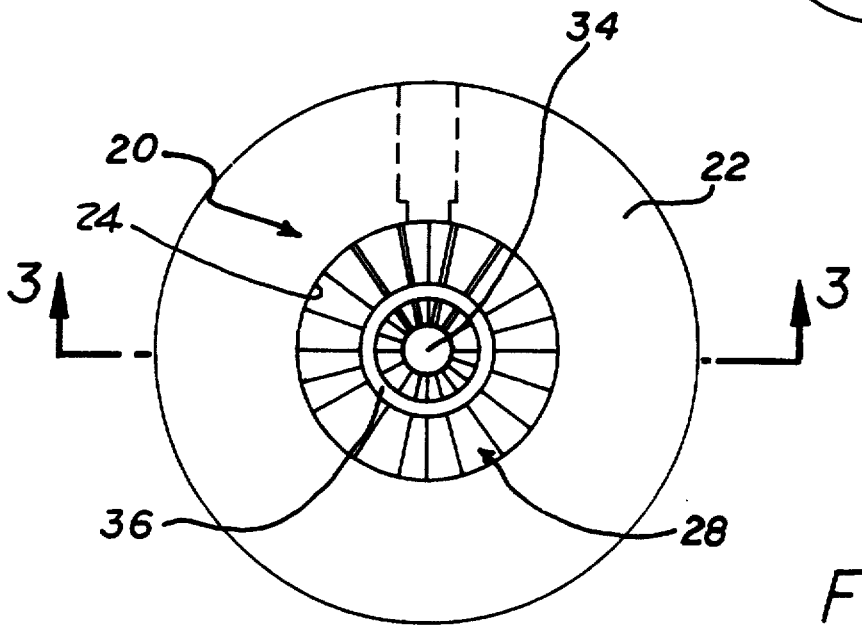
FIG. 2

HIGH IMPEDANCE CIRCUIT FOR INJECTION LOCKED MAGNETRONS

Matter enclosed in heavy brackets [ ] appears in the original patent but forms no part of this reissue specification; matter printed in italics indicates the additions made by reissue.

FIELD OF INVENTION

The present invention relates generally to injection locked magnetrons and more particularly to a high impedance circuit utilizing a novel vane structure.

BACKGROUND OF THE INVENTION

A study of injection locking of non-coherent oscillators is described in Adler, "A Study of Locking Phenomenon in Oscillators,". Proceedings of the IRE, June, 1946, pages 351–357. As described therein, the coherent bandwidth, ΔF, of an injection locked oscillator is substantially equal to the ratio given by (1) the product of twice the frequency of the oscillator and the square root of the ratio of the injected coherent power to the output power of the oscillator to (2) the external Q of the oscillator.

The study of injection locking by Adler was further developed by others. For example, see Huntoon & Weiss, "Synchronization of Oscillators," Proceedings of the IRE, December, 1947, pages 1415–1423. The Huntoon reference provides a strong theoretical basis for injection locking regardless of circuit configuration.

One of the earlier articles relating to the injection locking of magnetron oscillators is given in David, "R. F. Phase Control and Pulsed Magnetrons," Proceedings of the IRE, June, 1952, pages 669–685. Although the theoretical concept of injection locking of magnetrons is known, the practical reduction to practice in the prior art of injection locked magnetrons has not been realized until relatively recently. First, Appropriate low cost coherent sources of RF energy with sufficient power to drive magnetrons have not been available. Secondly, the existing magnetron circuits have an apparent limitation which limit the obtainable circuit bandwidth. The disadvantage resulting from this limitation is that the known magnetron circuits were insufficient for commercial exploitation.

Recent advances in solid state oscillators have all but eliminated the first limitation of the prior art noted above. Power levels for magnetrons are now [aVailable] *available* in the 0.5 to 5.0 kilowatt level. With current devices, coherent gains of ten to thirteen dB are achievable over narrow bandwidths. The exploitation of these advances for magnetrons has, however, been limited by the ability of conventional magnetron circuits to present a sufficiently high impedance to the electron stream in the interaction region to sustain proper magnetron operation over a sufficiently wide bandwidth.

In a known prior art magnetron with a conventional circuit configuration, manipulation of the coupling between the conventional circuit and its external load will reduce its external Q. The reduction of the external Q will achieve a wider injection locking bandwidth. Because of the fundamental relationship between the external Q and the loaded Q, this will cause the fields on the magnetron circuit to become lower and lower until a phenomenon called "sink" is reached. At this point the magnetron ceases to work. The reason is that the total RF impedance of the circuit becomes too low to sustain oscillation.

The fundamental relationships which govern this sink phenomenon can be summarized as follows:

$$\Delta F = 2F_o(P_i/P_o)^{\frac{1}{2}}/Q_e$$

$$Z_{int} = Q_l(L/C)^{\frac{1}{2}}$$

$$1/Q_l = 1/Q_o + 1/Q_e$$

wherein the locking bandwidth ΔF is given by Adler's equation, $Z_{int}$ is the interaction impedance of the magnetron, $Q_o$ is the unloaded Q of the magnetron circuit and is a function of the frequency of the magnetron, $Q_l$ is the loaded Q of the circuit, $Q_e$ is the external Q of the circuit, and [$(L/C)^{178}$] $(L/C)^{\frac{1}{2}}$ is the single cavity impedance of the magnetron and is a function of the configuration of the circuit.

From the above equations, it can be seen that the interaction impedance is the product of the loaded Q, $Q_l$, and the single cavity impedance of the magnetron. Because of the fundamental relationship between the loaded Q, which is related to the ability to maintain oscillation, and the external Q, which is related to the ability to obtain large injection bandwidth, decreasing the external Q for a fixed circuit decreases the loaded Q. As a consequence thereof, the interaction impedance $Z_{int}$, is also decreased.

SUMMARY OF THE INVENTION

The present invention is directed to a novel high impedance circuit to satisfy the conflicting requirements of wide bandwidth and sufficient circuit impedance so as to increase the single cavity impedance of the magnetron. The novel circuit, in lumped constant terms is a very high inductive, very low capacitive circuit.

According to the present invention, the high impedance circuit has radially disposed first vanes and radially disposed second vanes interdigitating between the first vanes. The first vanes and the second vanes are each interconnected by a first toroidal strap and a second toroidal strap, respectively. The first strap and the second strap are disposed co-axially on opposite sides of the vane structure. The vanes and straps are dimensioned so that the circuit has a single cavity impedance commensurate with a predetermined interaction impedance for the oscillator which is sufficient to sustain oscillation for a preselected injection locking bandwidth of the oscillator, in accordance with the above equations.

In one embodiment of the present invention, each of the vanes is generally T-shaped. Each vane has a relatively wide high conductive first portion and a relatively high inductance second portion. The first portion is disposed proximate to an axis of the cavity with the second portion extending radially outward therefrom.

Advantages of the present invention are the high-single cavity impedance of greater than 200 ohms in a 16 resonator configuration and a wide vane face which presents an adequate peak dissipation surface to the electron stream of the interaction space. This is an especially important advantage for high power applications. Other advantages of the present invention allow the independent control of the interaction impedance and the external Q by divorcing the single cavity impedance from the coupling circuit which controls the bandwidth. The simple shape of the vane allows it to be fabricated using conventional stamping operations. The toroidal strap can be easily made from available wire through a simple forming operation. The designs facilitate the manufacture of the circuit thereby reducing its cost.

These and other objects, advantages and features of the present invention will be readily apparent to those skilled in the art from a study of the following description of an exemplary preferred embodiment when read in conjunction with the attached drawings and appended claims.

BRIEF DESCRIPTION OF THE DRAWINGS

FIG. 1 is a schematic diagram of a typical magnetron oscillator circuit used in the prior art;

FIG. 2 is one view of the novel high impedance circuit constructed in accordance with the principles of the present invention;

DESCRIPTION OF AN EXEMPLARY PREFERRED EMBODIMENT

Referring now to FIG. 1, there is shown a schematic diagram illustrating the use of an injection lock magnetron 10. The source 12 of coherent microwave energy delivers low power energy to a circulator 14. The circulator injects the lower power energy into the magnetron 10. The low power energy is amplified by the magnetron 10 as is well known in the art. The amplified energy developed by the magnetron 10 is redirected to the circulator 14. The high power microwave energy is then coupled to an antenna 16 to radiate the high power coherent output energy.

Figure 3:
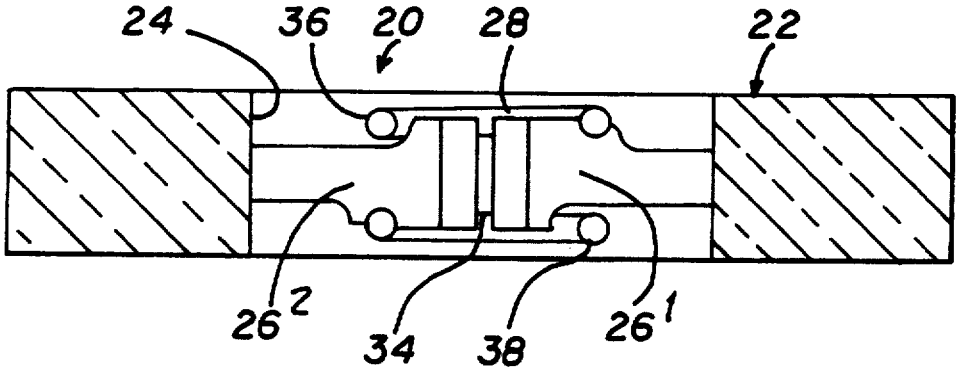
FIG. 3 is a view taken along line 3—3 of FIG. 2.
Figure 4:
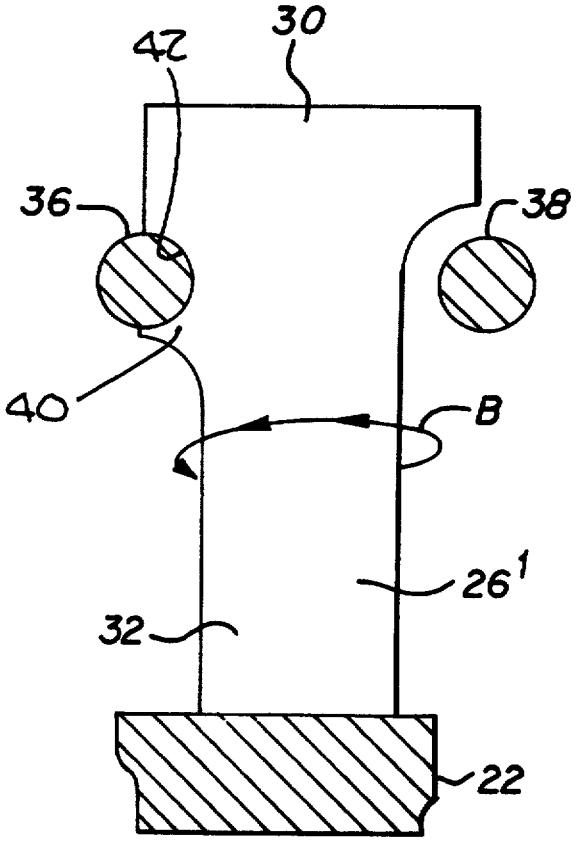
FIG. 4 is an enlarged view of a portion of FIG. 3.

Referring now to FIGS. 2–4, there is shown a high, impedance circuit 20 for an anode ring 22 in the magnetron 20. As is well known in the art, the circuit 20 is disposed within an inner cavity 24 of the anode ring 22.

The high impedance circuit 20 includes a plurality of first radial vanes $26^1$ and a plurality of second radial vanes $26^2$. The first radial vanes $26^1$ are coaxially positionable within the cavity 24. The second radial vanes $26^2$ are interdigital with the first vanes $26^1$ to form a vane structure 28. Each of the first vanes $26^1$ and second vanes $26^2$ has a relatively wide high conductance first portion 30 and a relatively narrow high inductance portion 32, as best seen in FIG. 4. The second portion 32 extends radially outward from the first portion 30. The first portion 30 is radially proximate to an axis 34 of the cavity about which the magnetron cathode is disposed.

The circuit further includes a first toroidal strap 26 and a second toroidal strap 38. Each of the first strap 36 and the second strap 38 are coaxial with the axis 34. The first strap is disposed along the first side of the vane structure 28. The second strap is disposed along the second side of the vane structure 28. The first strap interconnects the first vanes $26^1$ and the second strap 38 interconnects the second vanes $26^2$.

According to the present invention, each of the vanes $26^1$, $26^2$, the first strap 36, and second strap 38 are dimensioned so that the circuit 20 has a single cavity impedance commensurate with a predetermined interaction impedance of the oscillator which is sufficient to sustain oscillation for a preselected injection locking bandwidth, as is derived from the above references. More particularly, the relatively narrow second portion 32 concentrates rings of magnetic field, B, around the vane 26, as best seen in FIG. 4, to create a high inductance. The electric field between the vanes reverses direction between each of the first vanes $26^1$ and the second vanes $26^2$. The straps, being of circular cross-section, minimize capacitance of the circuit, while giving sufficient mode separation. Where the straps 36, 38 are connected to the appropriate one of the vanes $26^1$, $26^2$, a mounting portion 40 is provided therein with an annular channel 42. The second portion 32 of the vanes may be soldered to the anode ring 22.

By the equations given above, for a given injection lock bandwidth, $\Delta F$, the interactive impedance, $Z_{int}$, can be selected so that oscillation is maintained. It has been found that the interactive impedance, in the preferred embodiment, should be at least 5000 ohms. The shape of the vanes 26 are then structured so their inductance and capacitance satisfies the conditions set forth in the above equations. The T-shape of the vanes $26^1$, $26^2$, has been found to satisfy these conditions.

There has been described hereinabove a novel high impedance circuit for use in the anode ring of a magnetron. It is obvious that those skilled in the art may make numerous uses of the departures from the preferred embodiment of the present invention without departing from the inventive concepts herein. Accordingly, the present invention is to be defined solely by the scope of the following claims.

What is claimed is:

1. A high impedance circuit for an anode ring in an injection locked oscillator, said anode ring having an inner cavity, said circuit comprising:
   - a plurality of first radial vanes coaxially positionable in said cavity;
   - a plurality of second radial vanes interdigitating with said first vanes to form a vane structure;
   - said first and second vanes each having a relatively narrow high inductance portion;
   - a first toroidal strap coaxially disposed along a [first] side of said vane structure, said first strap interconnecting said first vanes;
   - a second toroidal strap coaxially disposed along [the second] *a* side of said vane structure, said second strap interconnecting said second vanes;
   - said first and second straps each having a relatively low capacitance due to said toroidal shape; and
   - said first vanes, said second vanes, said first strap, and said second strap being dimensioned so that said circuit has a high single cavity impedance commensurate with an interaction impedance of said oscillator which is sufficient to sustain oscillation for a preselected injection locking bandwidth of said oscillator.

2. A circuit as set forth in claim 1, wherein: said injection locking bandwidth, $\Delta F$, is given by:

$$\Delta F = 2F_o(P_i/P_o)[^{178}]\ ^{\frac{1}{2}}/Q_e$$

wherein $F_o$ is the frequency of said oscillator, $P_o$ is the power out of said oscillator, $P_i$ is the injected coherent power, and $Q_e$ is the external Q of said oscillator;

further wherein:

said interaction impedance, $Z_{int}$, is given by:

$$Z_{int} = Q_l(L/C)^{\frac{1}{2}}$$

wherein $Q_l$ is the loaded Q of said circuit, and $(L/C)[^{178}]\ ^{\frac{1}{2}}$ is said high single cavity impedance of said circuit; and further wherein:

said loaded Q, $Q_l$, is given by:

$$1/Q_l = 1/Q_o + 1/Q_e$$

wherein $Q_o$ is the unloaded Q of said circuit.

3. The circuit as set forth in claim 2, wherein said interactive impedance is at least 5000 ohms.

4. A circuit as set forth in claim 1, wherein each of said first vanes and said second vanes are identically configured, having a relatively wide [high conductance] first portion radially proximate to an axis of said cavity and a second portion formed by said relatively narrow high inductance portion extending radially outward from said first portion where said narrow second portion connects said first and second vanes to said anode ring.

5. A circuit as set forth in claim 1, wherein said first vanes and said second vanes are T-shaped.

6. A circuit as set forth in claim 5, wherein:

said first T-shaped vanes have a mounting portion between the top of said T-shape and one side of said narrow portion of said T-shape for connecting said first toroidal strap thereto;

said second T-shaped vanes have a mounting portion between the top of said T-shape and the opposite side of said narrow portion of said T-shape for connecting said second toroidal strap thereto; and said first vanes and said second vanes are identically shaped and oppositely disposed within said anode ring.

7. A high impedance circuit for an anode ring in an injection locked magnetron, comprising:

a plurality of vanes each having a narrow portion [for increasing the inductance of said circuit], *said circuit having an increased inductance due to said narrow portion;* at least one strap having a toroidal shape [including a circular cross-section for decreasing the capacitance of said circuit], *said circuit having a decreased capacitance due to said toroidal shape;* wherein the combination of said increased inductance and decreased capacitance increases the impedance of said circuit.

8. A circuit as set forth in claim 7, wherein:

said plurality of vanes are T-shaped.

9. A circuit as set forth in claim 8, wherein:

said plurality of T-shaped vanes each include an annular channel between the top of said T-shaped vane and said narrow portion thereof;

said vanes are mounted within said circuit with said channel up and, alternately, with said channel down; and said at least one strap includes two straps, a first strap for electrical connection to said plurality of vanes with said channel in said up mounted position and a second strap for electrical connection to said plurality of vanes with said channel in said down mounted position.

*10. A high impedance circuit for an injection locked oscillator having an inner cavity, said circuit comprising:*

*a plurality of vanes coaxially positionable in said cavity; and*

*at least one strap interconnecting a portion of said vanes, said vanes and strap being dimensioned so that said circuit has a high single cavity impedance commensurate with an interaction impedance of said oscillator which is sufficient to sustain oscillation for a preselected injection locking bandwidth of said oscillator;*

*wherein said injection locking bandwidth, $\Delta F$, is given by:*

$$\Delta F = \frac{2F_o\left(\frac{P_i}{P_o}\right)^{\frac{1}{2}}}{Q_e}$$

*wherein $F_o$ is the frequency of said oscillator, $P_o$ is power out of said oscillator, $P_i$ is the injected coherent power, and $Q_e$ is the external Q of said oscillator;*

*further wherein said interaction impedance, $Z_{int}$, is given by:*

$$Z_{int} = Q_l\left(\frac{L}{C}\right)^{\frac{1}{2}}$$

*wherein $Q_l$ is the loaded Q of said circuit, and $(L/C)^{\frac{1}{2}}$ is said high single cavity impedance of said circuit; and*

*further wherein $Q_l$ is given by:*

$$\frac{1}{Q_l} = \frac{1}{Q_o} + \frac{1}{Q_e}$$

*wherein $Q_o$ is the unloaded Q of the circuit and said interaction impedance is at least 5,000 ohms.*

*11. A circuit as set forth in claim 10, wherein said plurality of vanes are generally T-shaped.*

*12. A circuit as set forth in claim 10, wherein said plurality of vanes includes first vanes interdigitally disposed in said cavity with second vanes.*

*13. A circuit as set forth in claim 12, wherein each of said first vanes and said second vanes are identically configured, having a relatively wide first portion radially proximate to an axis of said cavity and a relatively narrow high inductance second portion extending radially outward from said first portion where said narrow second portion connects said first and second vanes to said circuit.*

*14. A circuit as set forth in claim 13, wherein said at least one strap includes two straps, a first strap electrically connecting said first vanes and a second strap electrically connecting said second vanes.*

*15. A circuit as set forth in claim 14, wherein said straps have a toroidal shape including a circular cross-section providing decreased capacitance of said circuit.*

*16. A circuit as set forth in claim 14, wherein said first vanes have a first mounting portion on a first side between said wide portion and said narrow portion, said first strap being connected to said first vanes at said first mounting portion.*

*17. A circuit as set forth in claim 16, wherein said second vanes have a second mounting portion on a second side between said wide portion and said narrow portion, said second strap being connected to said second vanes at said second mounting portion.*

*18. A circuit as set forth in claim 12, wherein said first vanes and said second vanes are oppositely disposed within said circuit.*

*19. A circuit as set forth in claim 10, further comprising an anode ring providing said cavity.*

*20. A circuit as set forth in claim 10, wherein said oscillator is a magnetron.*

* * * * *